United States Patent
Koda et al.

(10) Patent No.: US 12,444,666 B2
(45) Date of Patent: Oct. 14, 2025

(54) SEMICONDUCTOR DEVICE WITH BENT TERMINALS

(71) Applicant: Mitsubishi Electric Corporation, Tokyo (JP)

(72) Inventors: Kazuki Koda, Tokyo (JP); Shuhei Yokoyama, Tokyo (JP); Naoki Ikeda, Tokyo (JP); Shogo Shibata, Tokyo (JP); Keitaro Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 552 days.

(21) Appl. No.: 17/821,679

(22) Filed: Aug. 23, 2022

(65) Prior Publication Data

US 2023/0163051 A1 May 25, 2023

(30) Foreign Application Priority Data

Nov. 22, 2021 (JP) ................................ 2021-189315

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/4842* (2013.01);
(Continued)

(58) Field of Classification Search
CPC ........... H01L 23/49562; H01L 21/4825; H01L 23/49551; H01L 23/49555
(Continued)

(56) References Cited

U.S. PATENT DOCUMENTS

2010/0072607 A1* 3/2010 Chung ................ H01L 23/3157
257/E23.06
2018/0040540 A1* 2/2018 Kasuya ............ H01L 23/49568
(Continued)

FOREIGN PATENT DOCUMENTS

JP  3176067 U      6/2012
JP  2019-075523 A  5/2019
JP  2020-155706 A  9/2020

OTHER PUBLICATIONS

An Office Action issued by the German Patent and Trademark Office on Oct. 31, 2023, which corresponds to German Patent Application No. 102022126647.8 and is related to U.S. Appl. No. 17/821,679; with English language translation.
(Continued)

*Primary Examiner* — Quoc D Hoang
(74) *Attorney, Agent, or Firm* — Studebaker Brackett PLLC

(57) ABSTRACT

A semiconductor device includes: a semiconductor element; a mold member covering the semiconductor element; and a first terminal and a second terminal electrically connected to the semiconductor element, protruding from one side of the mold member, and alternating along the one side. The first terminal includes a first bend, and the second terminal includes: a second bend located further from the one side of the mold member than the first bend, and having the same width as the first bend in plan view.

13 Claims, 8 Drawing Sheets

(51) Int. Cl.
    *H01L 21/56*     (2006.01)
    *H01L 23/31*     (2006.01)

(52) U.S. Cl.
    CPC ........ *H01L 21/565* (2013.01); *H01L 23/3107* (2013.01); *H01L 23/4952* (2013.01); *H01L 23/49575* (2013.01)

(58) Field of Classification Search
    USPC ....................................................... 257/787
    See application file for complete search history.

(56) References Cited

U.S. PATENT DOCUMENTS

| | | |
|---|---|---|
| 2019/0221504 A1* | 7/2019 | Nishiyama .......... H01L 23/4952 |
| 2020/0303295 A1 | 9/2020 | Ichikawa et al. |
| 2023/0335480 A1 | 10/2023 | Ichikawa et al. |

OTHER PUBLICATIONS

An Office Action; "Notice of Reasons for Refusal," mailed by the Japanese Patent Office on Oct. 15, 2024, which corresponds to Japanese Patent Application No. 2021-189315 and is related to U.S. Appl. No. 17/821,679; with English language translation.

* cited by examiner

F I G. 2
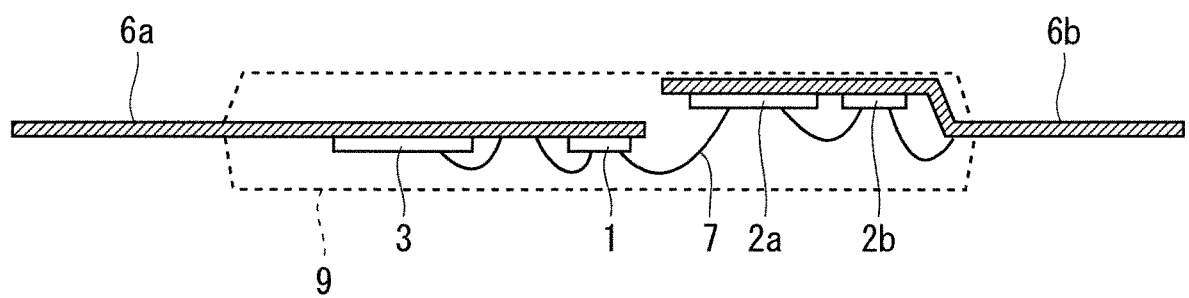

SEMICONDUCTOR DEVICE WITH BENT TERMINALS

BACKGROUND OF THE INVENTION

Field of the Invention

The present disclosure relates to semiconductor devices.

Description of the Background Art

A semiconductor device in which a plurality of terminals protruding from one side of a mold member are bent alternately at a location close to the mold member and at a location away from the mold member along the one side has been proposed. That is to say, the semiconductor device in which bends as bent portions of the terminals are staggered along the one side of the mold member has been proposed.

Furthermore, Japanese Patent Application Laid-Open No. 2019-75523 proposes a configuration in which bends located close to a mold member and bends located away from the mold member differ in width, for example.

In the configuration proposed in Japanese Patent Application Laid-Open No. 2019-75523, the bends located close to the mold member and the bends located away from the mold member differ in width. In this configuration, however, angles at which terminals are bent at the bends might vary when the terminals are bent with constant bending force.

SUMMARY

The present disclosure has been conceived in view of a problem as described above, and it is an object of the present disclosure to provide technology that can achieve a semiconductor device including appropriate terminals.

A semiconductor device according to the present disclosure includes: a semiconductor element; a mold member covering the semiconductor element; and a first terminal and a second terminal electrically connected to the semiconductor element, protruding from one side of the mold member, and alternating along the one side. The first terminal includes a first bend, and the second terminal includes: a second bend located further from the one side of the mold member than the first bend, and having the same width as the first bend in plan view; and a portion located between the one side of the mold member and the second bend of the second terminal, and being wider than the second bend.

The semiconductor device including appropriate terminals can be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross-sectional view illustrating the configuration of the semiconductor device according to Embodiment 1;

DESCRIPTION OF THE PREFERRED EMBODIMENTS

Embodiments will be described below with reference to the accompanying drawings. Features described in the embodiments below are examples, and all the features are not necessarily required. In description made below, similar components in the embodiments bear the same or similar reference signs, and different components will mainly be described. In description made below, specific locations and directions represented by terms such as "upper", "lower", "left", "right", "front", and "back" may not necessarily match locations and directions in actual implementation.

Embodiment 1

Figure 1:
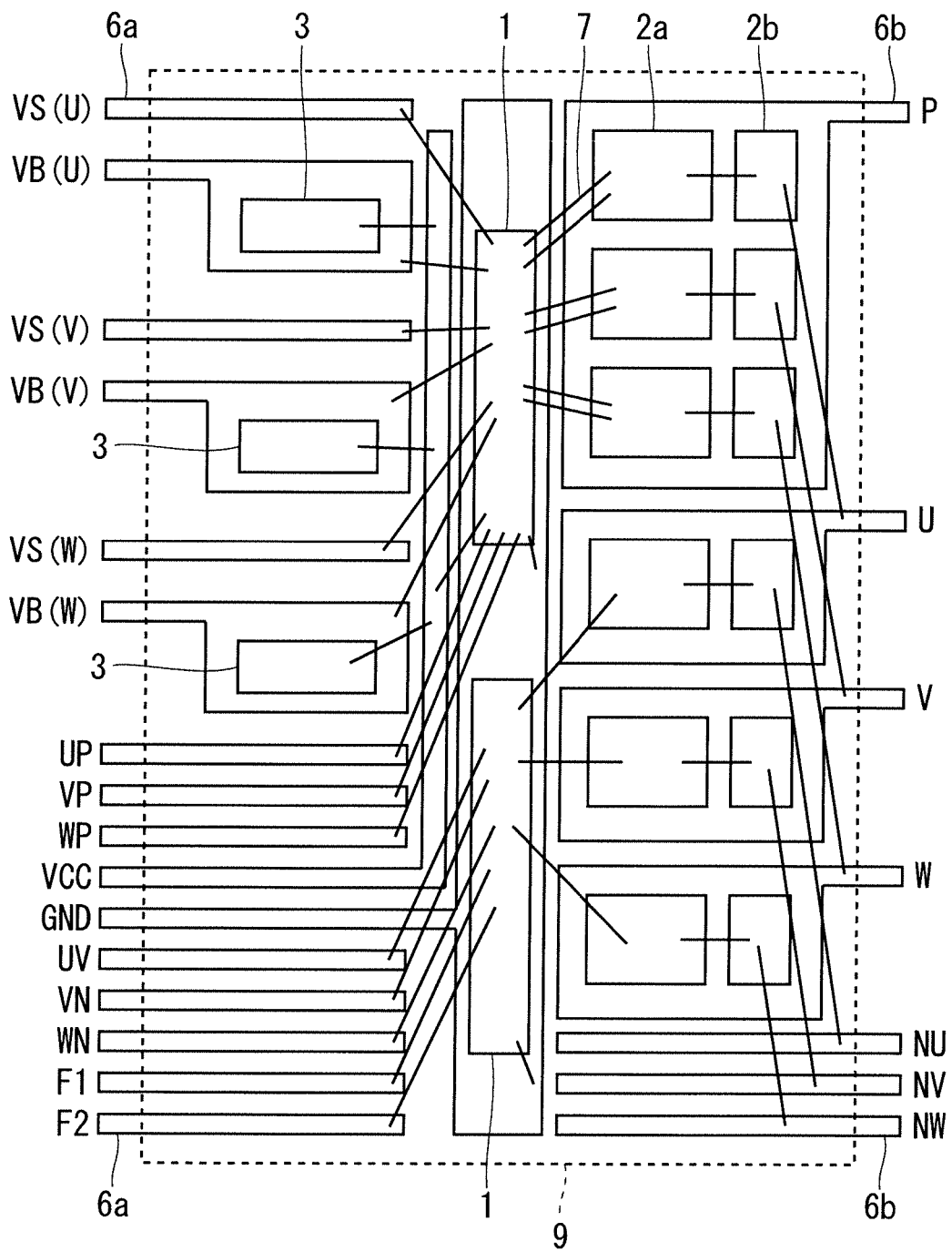
FIG. 1 is a plan view illustrating a configuration of a semiconductor device according to Embodiment 1.

FIG. 1 is a plan view illustrating a configuration of a semiconductor device according to Embodiment 1, and FIG. 2 is a cross-sectional view illustrating the configuration.

The semiconductor device according to Embodiment 1 includes semiconductor elements. The semiconductor elements include integrated circuits (ICs) 1, power chips 2a, freewheel diodes 2b, and bootstrap diodes 3. The ICs 1, the power chips 2a, the freewheel diodes 2b, and the bootstrap diodes 3 are electrically connected, and the power chips 2a and the freewheel diodes 2b as second semiconductor elements are controlled and driven by the ICs 1 as first semiconductor elements. An upper IC 1 in FIG. 1 is a high voltage IC to control an upper arm composed of three power chips 2a, and a lower IC in FIG. 1 is a low voltage IC to control a lower arm composed of three power chips 2a.

At least the ICs 1 or the power chips 2a are semiconductor switching elements, such as metal oxide semiconductor field effect transistors (MOSFETs) and insulated gate bipolar transistors (IGBTs). At least the freewheel diodes 2b or the bootstrap diodes 3 are diode elements, such as Schottky barrier diodes (SBDs) and PN junction diodes (PNDs).

In addition to the above-mentioned semiconductor elements, the semiconductor device according to Embodiment 1 includes a plurality of control terminals 6a, a plurality of power terminals 6b, wires 7, and a mold member 9.

The control terminals 6a are illustrated on a left side of FIGS. 1 and 2, and the power terminals 6b are illustrated on a right side of FIGS. 1 and 2. In an example of FIGS. 1 and 2, the control terminals 6a and the power terminals 6b are lead frames electrically connected to the semiconductor elements. The ICs 1 and the bootstrap diodes 3 are bonded to upper surfaces of any of the plurality of control terminals 6a, and the power chips 2a and the freewheel diodes 2b are bonded to upper surfaces of any of the plurality of power terminals 6b.

The wires 7 selectively connect the ICs 1, the power chips 2a, the freewheel diodes 2b, the bootstrap diodes 3, the control terminals 6a, and the power terminals 6b. An electrical circuit is formed by the connection. A material for the wires 7 includes gold, copper, and aluminum, for example.

The mold member 9 shown by dotted lines in FIGS. 1 and 2 covers the semiconductor elements, a portion of the control terminals 6a, a portion of the power terminals 6b, and the wires 7. The mold member 9 is a transfer mold member formed of an insulating member, such as resin. The mold member 9 is rectangular in plan view, and the plurality of control terminals 6a protrude from one side of the mold member 9 and the plurality of power terminals 6b protrude from another side opposite the one side of the mold member 9.

Figure 3:
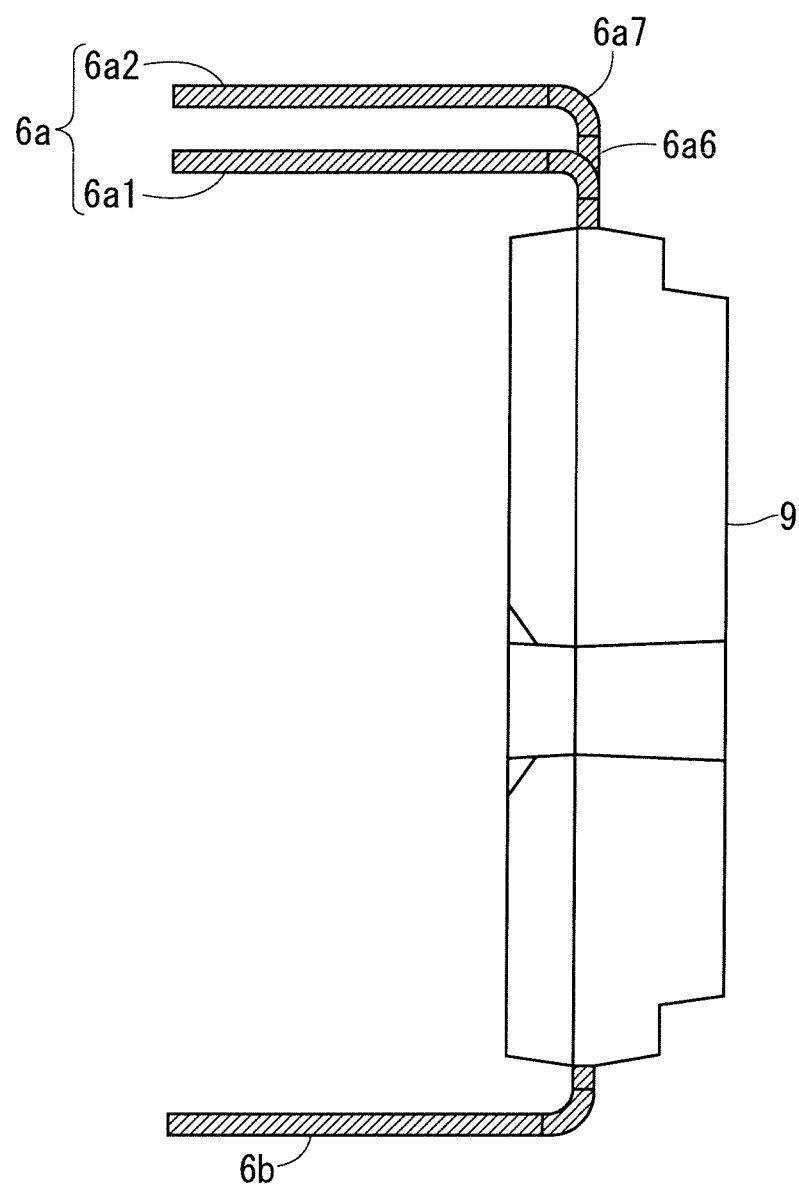
FIG. 3 is a side view illustrating an outer shape of the semiconductor device according to Embodiment 1.

FIG. 3 is a side view illustrating an outer shape of the semiconductor device according to Embodiment 1. Control terminals 6a are illustrated on an upper side of FIG. 3, and a power terminal 6b is illustrated on a lower side of FIG. 3. The plurality of control terminals 6a protrude from the same location along the thickness (a side to side direction in FIG. 3) of the mold member 9, and the plurality of power terminals 6b protrude from the same location along the thickness of the mold member 9. Portions of the control terminals 6a and the power terminals 6b not covered with the mold member 9 are illustrated to extend in an in-plane direction in FIG. 2 for the sake of convenience, but are accurately bent as illustrated in FIG. 3.

Figure 4:
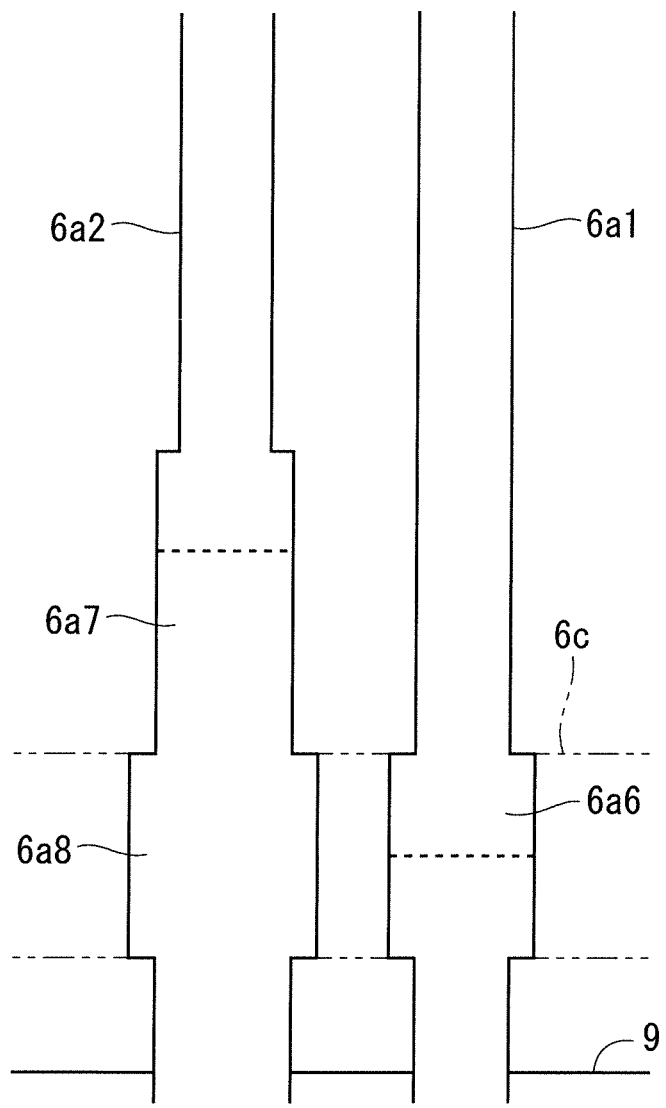
FIG. 4 is a plan view illustrating a portion of the configuration of the semiconductor device according to Embodiment 1.

FIG. 4 is a plan view illustrating the control terminals 6a before being bent. The plurality of control tell finals 6a include inner control terminals 6a1 as first terminals and outer control terminals 6a2 as second terminals. The inner control terminals 6a1 and the outer control terminals 6a2 alternate along the one side of the mold member 9, and a pair of an inner control terminal 6a1 and an outer control terminal 6a2 is illustrated in FIG. 4.

The inner control terminals 6a1 include inner bends 6a6 as first bends. The outer control terminals 6a2 include outer bends 6a7 as second bends and wide portions 6a8 as portions of the outer control terminals 6a2. In an example of FIGS. 3 and 4, the inner control terminals 6a1 are each bent at a single inner bend 6a6, and the outer control terminals 6a2 are each bent at a single outer bend 6a7.

The outer bend 6a7 is located further from the one side of the mold member 9 than the inner bend 6a6. That is to say, the distance between the one side of the mold member 9 and the outer bend 6a7 is greater than the distance between the one side of the mold member 9 and the inner bend 6a6. The inner control terminals 6a1 and the outer control terminals 6a2 alternate along the one side of the mold member 9, so that the inner bends 6a6 and the outer bends 6a7 are staggered along the one side of the mold member 9.

Figure 5:
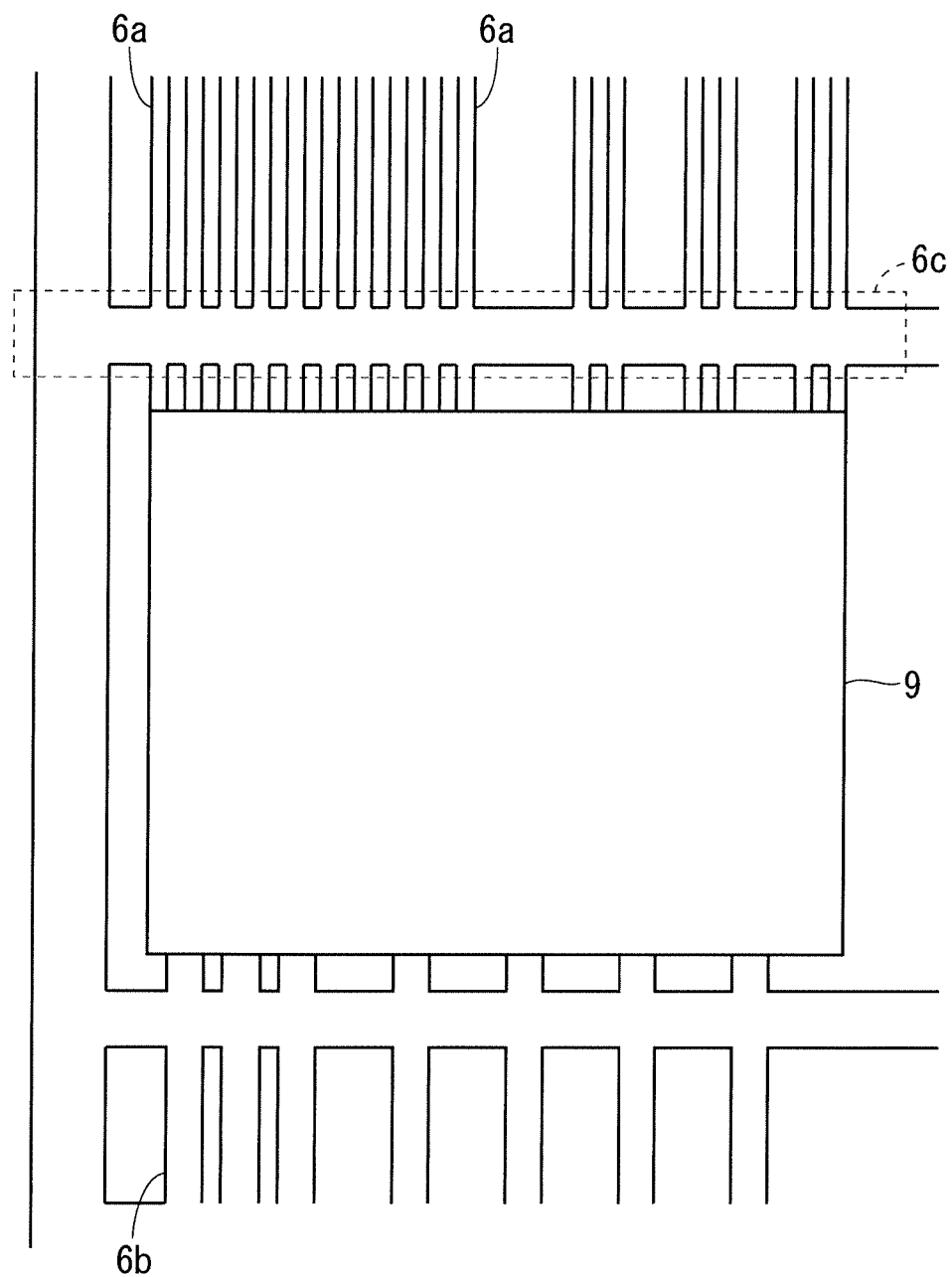
FIG. 5 is a plan view illustrating a portion of the configuration of the semiconductor device according to Embodiment 1.

A tie bar 6c in FIG. 4 includes a portion of the inner control terminal 6a1 and a portion of the outer control terminal 6a2. FIG. 5 is a plan view illustrating the semiconductor device before the inner control terminals 6a1 and the outer control terminals 6a2 are bent in a process of manufacturing the semiconductor device. In FIG. 5, the shapes of the inner control terminals 6a1 and the outer control terminals 6a2 are simplified. As illustrated in FIG. 5, the inner control terminals 6a1 and the outer control terminals 6a2 are substantially connected by the tie bar 6c.

Portions of the tie bar 6c shown in alternate long and two short dashes lines in FIG. 4 are removed by cutting, such as pressing. Portions of the tie bar 6c remaining after cutting correspond to the inner bends 6a6 of the inner control terminals 6a1 and the wide portions 6a8 of the outer control terminals 6a2. The wide portions 6a8 are located between the one side of the mold member 9 and the outer bends 6a7 of the outer control terminals 6a2.

As illustrated in FIG. 4, the inner bends 6a6 and the outer bends 6a7 have the same width in plan view. This means that a difference in width between the inner bends 6a6 and the outer bends 6a7 is, for example, 2% or less of the width of the inner bends 6a6 or the outer bends 6a7 herein. A portion of each of the inner control terminals 6a1 exposed from the mold member 9 is widest at the inner bend 6a6. A portion of each of the outer control terminals 6a2 exposed from the mold member 9 is widest at the wide portion 6a8, and is narrowest at a distal end portion (an upper portion in FIG. 4). In Embodiment 1 as described above, the wide portion 6a8 is wider not only than the outer bend 6a7 but also than the inner bend 6a6, which is separated from the one side of the mold member 9 by the distance between the one side of the mold member 9 and the wide portion 6a8.

Figure 6:
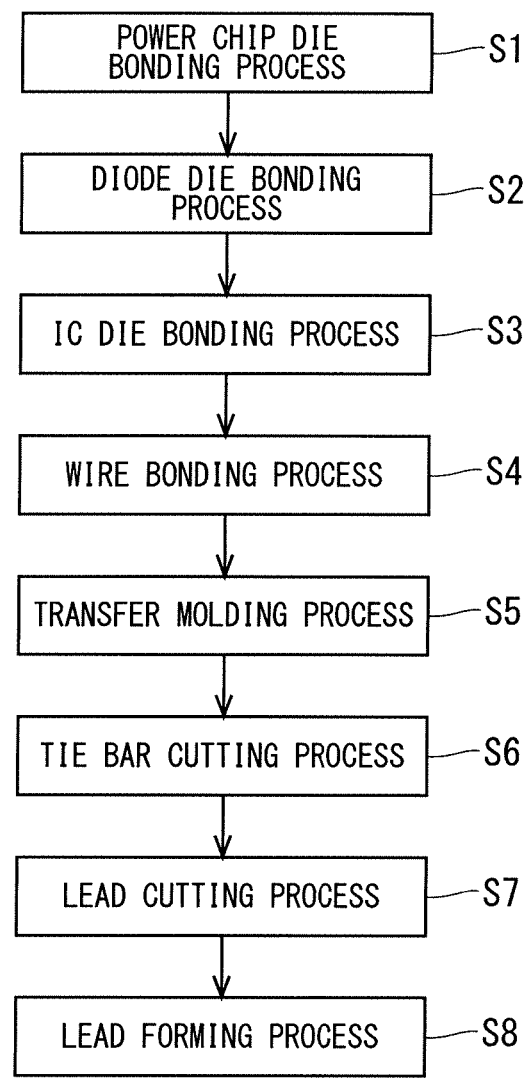
FIG. 6 is a flowchart showing a method of manufacturing the semiconductor device according to Embodiment 1.

FIG. 6 is a flowchart showing a method of manufacturing the semiconductor device according to Embodiment 1. First, in a power chip die bonding process in step S1, the power chips 2a are bonded to lead frames using bonding members, such as solder. In a diode die bonding process in step S2, the freewheel diodes 2b and the bootstrap diodes 3 are bonded to lead frames using bonding members, such as solder. In an IC die bonding process in step S3, the ICs 1 are bonded to a lead frame using bonding members, such as solder. The processes in steps S1 to S3 may be performed in parallel, or may be performed in a different order.

In a wire bonding process in step S4, the lead frames, the ICs 1, the power chips 2a, the freewheel diodes 2b, and the bootstrap diodes 3 are selectively connected by the wires 7 to form the electrical circuit. A state after completion of the wire bonding process substantially corresponds to a state in FIG. 1.

In a transfer molding process in step S5, a portion of the lead frames, the power chips 2a, the freewheel diodes 2b, the bootstrap diodes 3, the ICs 1, and the wires 7 are sealed with the mold member 9 to be insulated from the outside. A state after completion of the transfer molding process substantially corresponds to a state in FIG. 5.

In a tie bar cutting process in step S6, the portions in the alternate long and two short dashes lines in FIG. 4 are cut to be removed. In a lead cutting process in step S7, distal ends of the lead frames are formed by cutting, such as pressing, to form the inner control terminals 6a1 and the outer control terminals 6a2 before being bent.

In a lead forming process in step S8, the inner control terminals 6a1 are bent at the inner bends 6a6, and the outer control terminals 6a2 are bent at the outer bends 6a7. The semiconductor device according to Embodiment 1 as illustrated in FIG. 3 is manufactured by the above-mentioned processes.

Summary of Embodiment 1

In the semiconductor device according to Embodiment 1, the inner bends 6a6 and the outer bends 6a7 have the same width in plan view. A variation between an angle at which the inner control terminals 6a1 are bent at the inner bends 6a6 and an angle at which the outer control terminals 6a2 are bent at the outer bends 6a7 can thus be reduced even when the inner control terminals 6a1 and the outer control terminals 6a2 are bent with the same force.

In Embodiment 1, the wide portions 6a8 wider than the outer bends 6a7 are located between the one side of the mold member 9 and the outer bends 6a7 of the outer control terminals 6a2. According to such a configuration, deformation, by external force, of portions of the outer control terminals 6a2, which are more likely to be interfered with the outside than the inner control terminals 6a1, between the one side of the mold member 9 and the outer bends 6a7 can be suppressed.

In Embodiment 1, the semiconductor elements include the bootstrap diodes 3 covered with the mold member 9. According to such a configuration, a customer and the like are not required to externally attach the bootstrap diodes 3 to the mold member 9, so that an apparatus to which the semiconductor device is attached can be reduced in size.

<Modification 1>

While the plurality of control terminals 6a include the staggered bends in Embodiment 1, the power terminals 6b may include staggered bends. The power terminals 6b may include inner power terminals similar to the inner control terminals 6a1 and outer power terminals similar to the outer control terminals 6a2. That is to say, bends of the inner power terminals and bends of the outer power terminals may have the same width, and wide portions may be located between one side of the mold member 9 and the bends of the outer power terminals.

While the control terminals 6a and the power terminals 6b are located on two respective sides of the mold member 9 in Embodiment 1, the control terminals 6a and the power terminals 6b may be located on the same side of the mold member 9. In this configuration, the bends of the control terminals 6a and the power terminals 6b may be staggered without any distinction between the control terminals 6a and the power terminals 6b. The bends may have the same width in this configuration. Modification 1 may be applied to Embodiment 2, which will be described below.

<Modification 2>

Figure 7:
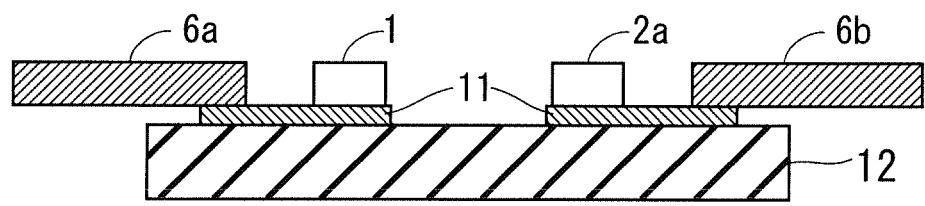
FIG. 7 is a cross-sectional view illustrating a portion of a configuration of a semiconductor device according to Modification 2.

While the semiconductor elements, such as the ICs 1, the power chips 2a, and the freewheel diodes 2b, are mounted on the lead frames in Embodiment 1, the configuration in the mold member 9 may be changed as appropriate. For example, the semiconductor device may include metal layers 11 and an insulating layer 12 as illustrated in FIG. 7. The metal layers 11 may electrically be connected to the control terminals 6a or the power terminals 6b by ultrasonic bonding, soldering, or the like, and the ICs 1, the power chips 2a, and the like may be mounted on the metal layers 11. The insulating layer 12 may be bonded to surfaces of the metal layers 11 opposite surfaces on which the semiconductor elements are mounted. The metal layers 11 and the insulating layer 12 may constitute an insulating substrate. Modification 2 may be applied to Embodiment 2, which will be described below.

<Modification 3>

While the semiconductor elements include the power chips 2a and the freewheel diodes 2b provided separately from each other in Embodiment 1, the semiconductor elements are not limited to such semiconductor elements. For example, the semiconductor elements may include elements each including a single semiconductor substrate having an IGBT region and a diode region, such as reverse conducting-IGBTs (RC-IGBTs). In a configuration in which the semiconductor elements include the RC-IGBTs, the semiconductor elements can be reduced in size compared with a configuration in which the semiconductor elements include the power chips 2a and the freewheel diodes 2b, so that the semiconductor device can be reduced in size.

A material for the semiconductor elements may include a wide bandgap semiconductor having a wider bandgap than silicon (Si). The wide bandgap semiconductor may include silicon carbide (SiC), gallium nitride (GaN), and diamond, for example. In a configuration in which the material for the semiconductor elements includes the wide bandgap semiconductor, lower energy losses or faster switching speeds of the semiconductor device can be achieved.

While the semiconductor elements include the first semiconductor elements and the second semiconductor elements in Embodiment 1, the semiconductor elements may include only the first semiconductor elements or only the second semiconductor elements. Modification 3 may be applied to Embodiment 2, which will be described below.

Embodiment 2

Figure 8:
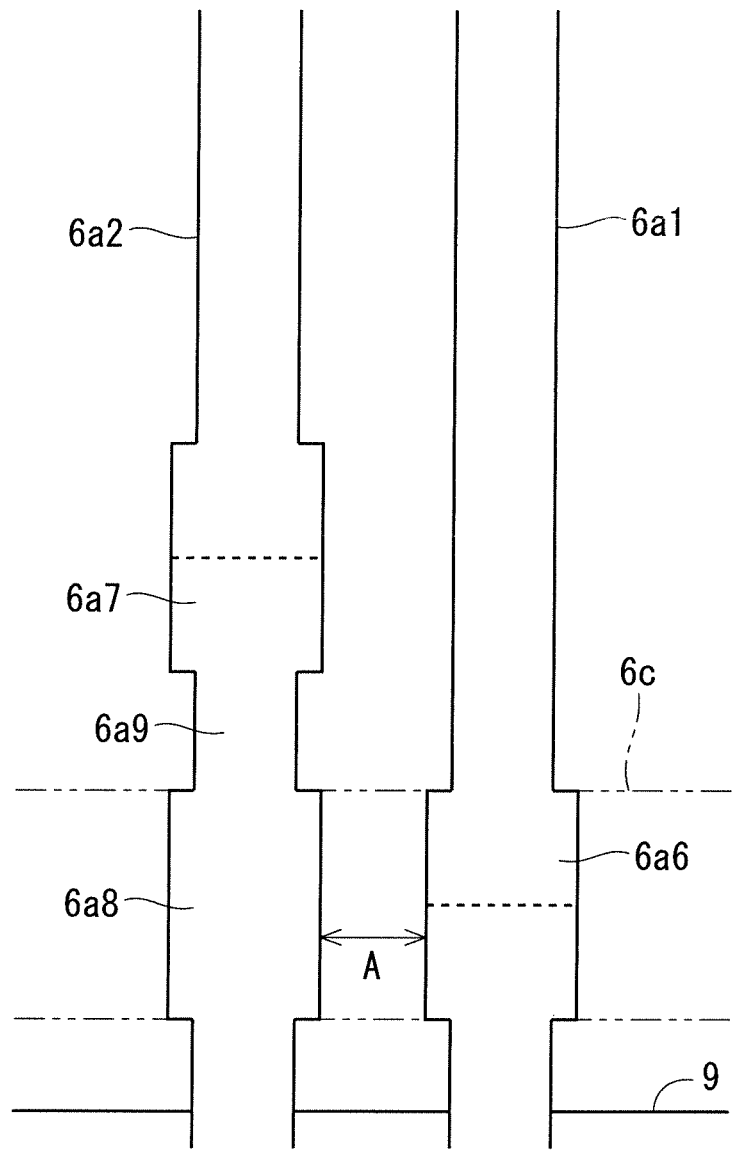
FIG. 8 is a plan view illustrating a portion of a configuration of a semiconductor device according to Embodiment 2.

FIG. 8 is a plan view illustrating a portion of a semiconductor device according to Embodiment 2, and is specifically a plan view illustrating the control terminals 6a before being bent. In Embodiment 2, the outer control terminals 6a2 each include the outer bend 6a7 as the second bend, the wide portion 6a8, and a constricted portion 6a9. The other configuration in Embodiment 2 is similar to that in Embodiment 1.

The wide portion 6a8 formed by tie bar cutting is located between the one side of the mold member 9 and the outer bend 6a7 of the outer control terminal 6a2 as in Embodiment 1. In Embodiment 2, the wide portion 6a8 may be wider than the outer bend 6a7, or may have the same width as or may be narrower than the outer bend 6a7 in plan view.

The constricted portion 6a9 is also referred to as a neck portion, and is located between the outer bend 6a7 and the wide portion 6a8. That is to say, the constricted portion 6a9 is narrower than each of the outer bend 6a7 and the wide portion 6a8 in plan view.

Summary of Embodiment 2

In the semiconductor device according to Embodiment 2 as described above, a distance A between the inner bend 6a6 and the wide portion 6a8 can be increased due to the presence of the constricted portion 6a9. This can increase a tie bar cutting area, that is, a punching area to reduce wear of a punching die. The tie bar cutting area can be increased to increase the distance A as an insulating distance between the inner control terminal 6a1 and the outer control terminal 6a2, so that insulation can be improved, or the semiconductor device can be reduced in size by bringing the terminals closer to each other. The distance A can be further increased when the wide portion 6a8 is narrower than the outer bend 6a7 in plan view.

Embodiments and modifications can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element;
   a mold member covering the semiconductor element; and
   a first terminal and a second terminal electrically connected to the semiconductor element, protruding from one side of the mold member, and adjacent to each other along the one side, wherein
   the first terminal includes a first bend, and
   the second terminal includes:
      a second bend located further from the one side of the mold member than the first bend, and having the same width as the first bend in plan view; and a portion located between the one side of the mold member and the second bend of the second terminal, and being wider than the second bend, wherein the portion and the first bend have a same distance to the one side of the mold member.

2. The semiconductor device according to claim 1, wherein
at least one of the first terminal and the second terminal is a lead frame on which the semiconductor element is mounted.

3. The semiconductor device according to claim 1, further comprising:
a metal layer which is electrically connected to at least one of the first terminal and the second terminal, and on which the semiconductor element is mounted; and
an insulating layer bonded to a surface of the metal layer opposite a surface on which the semiconductor element is mounted.

4. The semiconductor device according to claim 1, wherein
the semiconductor element comprises a first semiconductor element and a second semiconductor element controlled by the first semiconductor element.

5. The semiconductor device according to claim 1, wherein
the semiconductor element comprises a bootstrap diode covered with the mold member.

6. The semiconductor device according to claim 1, wherein
a material for the semiconductor element comprises a wide bandgap semiconductor.

7. The semiconductor device according to claim 1, wherein
the semiconductor element comprises an element including a single semiconductor substrate having an IGBT region and a diode region.

8. The semiconductor device according to claim 1, wherein the semiconductor device further comprises a plurality of the first terminal and a plurality of the second terminal, the plurality of the first terminal and the plurality of the second terminal alternating along the one side.

9. The semiconductor device according to claim 1, wherein the second bend bends in a same direction as the first bend.

10. A semiconductor device comprising:
a semiconductor element;
a mold member covering the semiconductor element; and
a first terminal and a second terminal electrically connected to the semiconductor element, protruding from one side of the mold member, and adjacent to each other along the one side, wherein
the first terminal includes a first bend, and
the second terminal includes:
a second bend located further from the one side of the mold member than the first bend, and having the same width as the first bend in plan view; and
a constricted portion located between the one side of the mold member and the second bend of the second terminal, the constricted portion being located further from the one side of the mold member than the first bend.

11. The semiconductor device according to claim 10, wherein the semiconductor device further comprises a plurality of the first terminal and a plurality of the second terminal, the plurality of the first terminal and the plurality of the second terminal alternating along the one side.

12. The semiconductor device according to claim 10, wherein the second bend bends in a same direction as the first bend.

13. A semiconductor device comprising:
a semiconductor element;
a mold member covering the semiconductor element; and
a plurality of first terminals and a plurality of second terminals electrically connected to the semiconductor element, protruding from one side of the mold member, and the plurality of first terminals and the plurality of second terminals being alternatively arranged in a staggered manner along the one side, wherein
the plurality of first terminals each include a first bend, and
the plurality of second terminals each include:
a second bend located further from the one side of the mold member than the first bend, and having the same width as the first bend in plan view; and
a portion located between the one side of the mold member and the second bend of the plurality of second terminals, and being wider than the second bend.

* * * * *